United States Patent
Stiens et al.

(10) Patent No.: US 10,407,777 B2
(45) Date of Patent: Sep. 10, 2019

(54) COATED CUTTING TOOL INSERT WITH MT-CVD TICN ON TIAI(C,N)

(71) Applicant: WALTER AG, Tubingen (DE)

(72) Inventors: Dirk Stiens, Tubingen (DE); Thorsten Manns, Tubingen (DE); Sakari Ruppi, Portimao (PT)

(73) Assignee: WALTER AG, Tubingen (DE)

( * ) Notice: Subject to any disclaimer, the term of this patent is extended or adjusted under 35 U.S.C. 154(b) by 126 days.

(21) Appl. No.: 15/514,275

(22) PCT Filed: Sep. 3, 2015

(86) PCT No.: PCT/EP2015/070185
§ 371 (c)(1),
(2) Date: Mar. 24, 2017

(87) PCT Pub. No.: WO2016/045937
PCT Pub. Date: Mar. 31, 2016

(65) Prior Publication Data
US 2017/0275765 A1    Sep. 28, 2017

(30) Foreign Application Priority Data
Sep. 26, 2014    (EP) .................... 14186609

(51) Int. Cl.
| B23B 27/14 | (2006.01) |
| C23C 28/04 | (2006.01) |
| C23C 16/34 | (2006.01) |
| C23C 16/36 | (2006.01) |

(52) U.S. Cl.
CPC .......... *C23C 28/042* (2013.01); *B23B 27/148* (2013.01); *C23C 16/34* (2013.01); *C23C 16/342* (2013.01); *C23C 16/36* (2013.01); *C23C 28/044* (2013.01); *B23B 2224/32* (2013.01); *B23B 2228/04* (2013.01); *B23B 2228/105* (2013.01)

(58) Field of Classification Search
USPC .......... 51/307, 309; 428/325, 336, 697, 698, 428/699, 704
See application file for complete search history.

(56) References Cited

U.S. PATENT DOCUMENTS

| 6,756,111 | B1 | 6/2004 | Okada et al. | |
| 7,348,051 | B2 | 3/2008 | Osada et al. | |
| 7,524,569 | B2 * | 4/2009 | Okamura | B23B 27/04 |
| | | | | 428/325 |
| 7,767,320 | B2 | 8/2010 | Endler | |
| 8,012,535 | B2 | 9/2011 | Sottke et al. | |
| 8,257,841 | B2 | 9/2012 | Endler et al. | |
| 8,389,134 | B2 * | 3/2013 | Van Den Berg | C23C 30/005 |
| | | | | 428/697 |
| 2005/0260454 | A1 | 11/2005 | Fang et al. | |
| 2008/0260947 | A1 * | 10/2008 | Gates | C23C 16/36 |
| | | | | 427/255.394 |
| 2015/0158094 | A1 * | 6/2015 | Igarashi | C23C 16/36 |
| | | | | 428/216 |

FOREIGN PATENT DOCUMENTS

| CN | 103372764 A | | 10/2013 |
| EP | 0709483 | * | 5/1996 |
| EP | 1245700 A1 | | 10/2002 |
| EP | 1626105 A1 | | 2/2006 |
| EP | 1897970 A1 | | 3/2008 |
| EP | 2604720 A1 | | 6/2013 |
| JP | 08-090310 | * | 4/1996 |
| JP | 2009-056538 | * | 3/2009 |
| JP | 2013252607 A | | 12/2013 |
| JP | 2014128837 A | | 7/2014 |
| WO | 2009112115 A1 | | 9/2009 |
| WO | 2009112116 A1 | | 9/2009 |
| WO | 2012126030 A1 | | 9/2012 |
| WO | 2013133441 | * | 9/2013 |

OTHER PUBLICATIONS

Endler et al "Aluminum-rich TiAlCN coatings by Low Pressure CVD" Surface & Coatings Tech 205 (2010) p. 1307-1312 (Year: 2010).*

* cited by examiner

*Primary Examiner* — Archene A Turner
(74) *Attorney, Agent, or Firm* — Corinne R. Gorski

(57) ABSTRACT

A coated cutting tool includes a substrate of cemented carbide, cermet, ceramics, steel or cubic boron nitride, a multi-layered wear resistant coating and at least two refractory coating layers deposited. The at least two refractory coating layers include a first coating layer and a second coating layer deposited on top of each other. The first coating layer is titanium aluminum nitride or carbonitride $Ti_{1-u}Al_uC_vN_w$, with $0.2 \leq u \leq 1.0$, $0 \leq v \leq 0.25$ and $0.7 \leq w \leq 1.15$ deposited by CVD. The second coating layer is titanium carbonitride $Ti_xC_yN_{1-y}$, with $0.85 \leq x \leq 1.1$ and $0.4 \leq y \leq 0.85$, and is deposited on top of the first coating layer by MT-CVD. The second $Ti_xC_yN_{1-y}$ coating layer has a columnar grain morphology and the overall fiber texture of the $Ti_xC_yN_{1-y}$ coating layer is characterized by a texture coefficient TC (1 1 1)>2.

10 Claims, No Drawings

COATED CUTTING TOOL INSERT WITH MT-CVD TICN ON TIAl(C,N)

RELATED APPLICATION DATA

This application is a § 371 National Stage Application of PCT International Application No. PCT/EP2015/070185 filed Sep. 3, 2015 claiming priority of EP application Ser. No. 14186609.5, filed Sep. 26, 2014.

FIELD OF THE INVENTION

The present invention relates to a coated cutting tool comprising a multi-layered wear resistant coating including at least one coating layer of titanium aluminium nitride or carbonitride and at least one coating layer of titanium carbonitride, the coated cutting tool having enhanced resistance against wear in intermittent cutting, especially enhanced resistance against thermal cracking.

BACKGROUND OF THE INVENTION

Cutting tools for chip forming metal machining consist of a substrate body of cemented carbide, cermet, ceramics, steel or cubic boron nitride that is usually coated with a single-layered or multi-layered hard coating to improve cutting properties and wear resistance. The hard coating consists of polycrystalline mono-metallic or multi-metallic hard phases. Examples of mono-metallic hard phases are TiN, TiC, TiCN and $Al_2O_3$. Examples of multi-metallic hard phases are TiAlN and TiAlCN. The hard phase coating layers are deposited on the substrate by CVD or PVD methods.

Polycrystalline hard phase coatings deposited by CVD or PVD methods can be grown with strong preferential crystallographic orientation, also called fiber texture. In recent developments to improve cutting performance and wear resistance of coated cutting tools, CVD and PVD coatings have been grown with different preferential crystallographic orientations, i. e. fiber textures, each of which may yield favorable performance in different cutting operations due to the anisotropic properties of the coating materials. An example is the use of highly {0 0 1} textured $\alpha$-$Al_2O_3$ coatings in turning operations with the crystallographic planes {0 0 1} preferentially oriented parallel to the substrate surface.

U.S. Pat. No. 7,767,320 discloses a hard coating deposited by CVD and comprising a layer of face-centered cubic (fcc) $Ti_{1-x}Al_xN$ with 0.75<x<0.93 and a process for its production.

U.S. Pat. No. 8,257,841 discloses a hard coating deposited by CVD comprising a layer of TiN, TiCN or TiC deposited directly on the substrate surface, followed by an adhesion layer having a phase gradient and a subsequent layer of TiAlN. The TiAlN layer has a fiber texture with the crystallographic {2 0 0} planes preferentially oriented parallel to the substrate surface.

WO 2009/112116 discloses hard coatings of TiAlN, TiAlC or TiAlCN having a high content of Al and a face-centered cubic (fcc) crystal lattice and being deposited by CVD on top of a TiCN or $Al_2O_3$ layer. It is not disclosed whether the coatings have preferential crystallographic orientation. WO 2009/112117 discloses hard coatings comprising a layer of (Ti, Me)Al(C,N) with Me=Zr or Hf to increase the hardness of the layer. WO2009112115A1 teaches a body with a hard coating comprising an outer $Al_2O_3$ layer on top of a TiAlN, TiAlC or TiAlCN layer.

The most commonly used CVD coatings to increase the wear resistance of cutting tools are $\alpha$-$Al_2O_3$ coatings and TiCN coatings deposited by moderate temperature CVD (MT-CVD).

Bartsch et al. have obtained TiC coatings with the crystallographic planes {1 1 1} preferentially oriented parallel to the substrate surface by the use of aromatic hydrocarbons as precursors at deposition temperatures ≥1000° C. These coatings provided superior wear resistance compared to TiC coatings with the crystallographic planes {1 0 0} preferentially oriented parallel to the substrate surface in turning of cast iron (K. Bartsch et al., Advances in Inorganic Films and Coatings (1995), 11-18).

For TiCN coatings it is known that good wear resistance, especially resistance against flank wear, can be achieved with coatings produced by the moderate temperature CVD (MT-CVD) process, as opposed to high temperature CVD (HT-CVD) processes. The MT-CVD process is run in a temperature range of 675-950° C., and makes use of nitrile compounds, most commonly acetonitrile, to yield so called MT-TiCN coatings with a columnar microstructure which is considered favorable for metal cutting. MT-TiCN coatings have been reported to have different crystallographic fiber textures.

Larsson and Ruppi (Thin Solid Films 402 (2002) 203-210) compare the metal cutting properties of untextured TiCN coatings deposited by high temperature CVD (HT-CVD) exhibiting a microstructure with equiaxed grains, and {211} textured MT-TiCN coatings with columnar structure. The MT-TiCN coating has a better chipping resistance, but lower resistance to crater wear than the HT-TiCN coating.

U.S. Pat. No. 6,756,111 discloses a multi-layer coating with an outer MT-TiCN layer having any one of {110}, {311}, {331} or {211} fiber texture.

U.S. Pat. No. 8,012,535 discloses MT-TiCN coatings obtained in the temperature range of 880-970° C. with the addition of a monocyclic hydrocarbon, e.g. benzene, to the gas phase yielding coatings with {221}, {331} or {110} fiber texture.

U.S. Pat. No. 7,348,051 discloses MT-TiCN coatings with a preferential crystallographic orientation with the crystallographic planes {1 1 2} preferentially oriented parallel to the substrate surface or with a deviation of less than 10 degrees from that, as determined by EBSD.

EP 2 604 720 A1 discloses a tool with a columnar fine grained MT-TiCN coating layer having an average grain width of 0.05 µm to 0.4 µm and a carbon content (C/(C+N)) of 0.50 to 0.65. The columnar MT-TiCN layer has a strong {211} fiber texture with considerable {311} fiber texture component, and it comprises twinned columnar grains.

Twin formation in TiCN CVD coatings is a well-known phenomenon. Using the coincidence site lattice (CSL) formalism, a twin can be described as Σ3 grain boundary, and high twin formation in TiCN CVD coatings correlates with a high relative length of Σ3 grain boundaries of the sum of grain boundaries of ΣN-type EP 1 626 105 A1 discloses a TiCN layer of thickness between 3 µm and 20 µm having a high relative length of Σ3 grain boundaries as defined by the ratio of lattice points of Σ3 to ΣN with N=2n+1, 1≤n≤14 in the range of 60% to 80%, in contrast to ≤30% Σ3 grain boundaries found in conventional coatings.

EP 1 897 970 discloses a coated cutting tool comprising a columnar TiCN layer with a carbon content (C/(C+N)) of 0.7 to 0.9, and with an average grain size parallel to the surface (grain width) of 0.05 µm to 0.5 µm. The XRD peak ascribed to the {4 2 2} crystallographic plane has a half width of 0.40° to 0.60°, and is preferably the peak having the highest intensity.

WO 2012/126030 discloses a body with a multi-layer coating comprising an $Al_xTi_{1-x}N$ layer deposited on a TiCN layer with elongate crystals. The majority of the $Al_xTi_{1-x}N$ layer has the cubic crystal structure, however, it comprises up to 30 mole-% of hexagonal phase AlN. The coating system is described to show enhanced wear resistance compared to PVD $Al_xTi_{1-x}N$ coatings.

Generally, for milling of cast iron and steel the use of CVD coated cemented carbide grades is preferred over PVD coated grades, especially for applications using high cutting speeds.

Typical CVD coated milling tools have a multi-layer coating comprising a thin TiN adhesion layer immediately on the substrate surface, an inner MT-TiCN layer and an outermost $\alpha\text{-}Al_2O_3$ layer as the main wear resistant layer. While CVD coated cutting tools offer good wear resistance at high cutting speeds, the resistance to thermo-mechanical shocks occurring in intermittent cutting is still limited. Therefore a typical wear mechanism of milling tools is the occurrence of thermal cracks or comb cracks, respectively, on the primary cutting edge.

OBJECT OF THE INVENTION

It is an object of the present invention is to provide a coated cutting tool having enhanced resistance against wear in intermittent cutting, especially enhanced resistance against thermal cracking over the prior art.

DESCRIPTION OF THE INVENTION

The present invention provides a coated cutting tool consisting of a substrate of cemented carbide, cermet, ceramics, steel or cubic boron nitride and a multi-layered wear resistant coating having a total coating thickness from 5 to 25 μm and comprising at least two refractory coating layers deposited by chemical vapour deposition (CVD) or moderate temperature chemical vapour deposition (MT-CVD), the at least two refractory coating layers including a first coating layer and a second coating layer being deposited on top of each other, wherein the first coating layer consists of titanium aluminium nitride or carbonitride $Ti_{1-u}Al_uC_vN_w$, with $0.2 \le u \le 1.0$, $0 \le v \le 0.25$ and $0.7 \le w \le 1.15$, and is deposited by CVD at a reaction temperature in the range from 600° C. to 900° C., the second coating layer consists of titanium carbonitride $Ti_xC_yN_{1-y}$, with $0.85 \le x \le 1.1$ and $0.4 \le y \le 0.85$, and is deposited on top of the first coating layer by MT-CVD at a reaction temperature in the range from 600° C. to 900° C., wherein the second $Ti_xC_yN_{1-y}$ coating layer has a columnar grain morphology and the overall fiber texture of the $Ti_xC_yN_{1-y}$ coating layer is characterized by a texture coefficient TC (1 1 1)>2, the TC (1 1 1) being defined as follows:

$$TC(111) = \frac{I(111)}{I_0(111)} \left[ \frac{1}{n} \sum_{n=1}^{n} \frac{I(hkl)}{I_0(hkl)} \right]^{-1},$$

wherein
(h k l)=measured intensity of the (hkl) reflection
$I_0$ (h k l)=standard intensity of the standard powder diffraction data according to JCPDF-card no. 42-1489 n=number of reflections used in the calculation, whereby the (hkl) reflections used are: (1 1 1), (2 0 0), (2 2 0) and (3 1 1).

It has surprisingly found that the coated cutting tool of the present invention exhibits enhanced resistance against wear in intermittent cutting, and especially enhanced resistance against thermal cracking, compared to the prior art. The term "cutting tool", as used herein, includes replaceable cutting tool inserts, indexable cutting tool inserts, but also solid cutting tools.

The present invention combines the novel multi-layered wear resistant coating structure, comprising a first CVD coating layer of titanium aluminium nitride or carbonitride, $Ti_{1-u}Al_uC_vN_w$, followed by a second MT-CVD coating layer of titanium carbonitride, $Ti_xC_yN_{1-y}$, with a specifically preferred fiber texture of the second $Ti_xC_yN_{1-y}$ layer wherein the geometrically equivalent crystallographic planes {1 1 1} are found to be preferentially oriented parallel to the substrate, expressed herein as the texture coefficient TC (1 1 1).

According to the most preferred embodiment of the present invention, the first coating layer and the second coating layer are deposited immediately on top of each other, i. e. without any intermediate layer. However, the scope of the invention shall also include those embodiments comprising a thin isomorphous intermediate layer present between the first coating layer and the second coating layer, provided that the epitaxy and the remaining properties of the layer sequence are not substantially altered by such an intermediate layer. As an example, an intermediate layer could be a 5 to 30 nm thin TiN or TiC layer.

In the prior art, CVD coatings comprising both, a coating layer of titanium aluminium nitride or carbonitride as well as a coating layer of titanium carbonitride are known, even though such combinations wherein such coating layers are in direct contact with each other are not found very frequently. However, the prior art discloses only coating sequences having a coating layer of titanium carbonitride followed by a coating layer of titanium aluminium nitride or carbonitride. Since titanium aluminium nitride or carbonitride coatings are known to have superior oxidation resistance over titanium carbonitride coatings, coating sequences with the aluminium-containig layer as the outer layer are considered advantageous. There is no disclosure in the prior art of the opposite coating sequence according to the present invention, with the CVD coating layer of titanium aluminium nitride or carbonitride followed by the MT-CVD coating layer of titanium carbonitride. And, most prior art titanium carbonitride coating layers have preferred growth orientations or fiber textures, respectively, other than the second $Ti_xC_yN_{1-y}$ layer of the present invention. Thus, there is no disclosure in the prior art and it was very surprising that such a coating sequence in combination with the preferred growth orientation of the second $Ti_xC_yN_{1-y}$ layer, expressed by the TC (1 1 1), would have superior properties in respect of resistance against wear in intermittent cutting and enhanced resistance against thermal cracking.

In a preferred embodiment of the coated cutting tool of the present invention the second $Ti_xC_yN_{1-y}$ coating layer has a thickness L and an average grain diameter W, and the ratio L/W<8, preferably L/W<5.

It has surprisingly found that, if the ratio of layer thickness to average grain diameter, L/W, of the second $Ti_xC_yN_{1-y}$ coating layer is less than 8, the wear resistance in cutting, especially in milling operations, is significantly improved over coatings with $Ti_xC_yN_{1-y}$ coating layers of the prior art having higher a ratio of layer thickness to average grain diameter. The low L/W ratios according to this invention are obtained by applying typical growth conditions for MT-TiCN as given in the working examples below immediately on top the first $Ti_{1-u}Al_uC_vN_w$ coating layer. Surprisingly, the growth direction of the grain boundaries in the second $Ti_xC_yN_{1-y}$ coating layer is altered with respect to conventional coatings, leading to a grain broadening and thus formation of grains with a smaller L/W ratio. Application of the same growth conditions on coating schemes according to the prior art leads to a grain boundary growth direction more strictly directed towards the surface normal, and thus narrower columnar grains with L/W ratios>8 are obtained.

In another preferred embodiment of the coated cutting tool of the present invention the grains of the second $Ti_xC_yN_{1-y}$ coating layer have an average grain diameter W of ≥0.4 µm, preferably ≥0.7 µm, more preferably of a ≥1.1 µm.

It has surprisingly found that, if the average grain diameter W of the grains of the second $Ti_xC_yN_{1-y}$ coating layer is 0.4 µm or more, the wear resistance in cutting, especially in milling operations, is significantly improved over coatings with $Ti_xC_yN_{1-y}$ coating layers of the prior art having grains of smaller grain diameters. This surprising effect may be related with the smaller number of grain boundaries per surface area found in the $Ti_xC_yN_{1-y}$ coating layers according to this invention compared to prior art coatings. Apparently, in the $Ti_xC_yN_{1-y}$ coating layer wear and fracture are initiated at grain boundaries during cutting operations, due to mechanical weakness and/or diffusion of elements from the work piece material into the coating. At a thickness of the second $Ti_xC_yN_{1-y}$ coating layer of more than 3.5 µm, the coating process according to this invention produces grain diameters a ≥0.7 µm. Slower deposition rates were observed to favour growth of even broader grains having an average diameter of ≥1.1 µm, which were found to have even better properties in metal cutting.

In another preferred embodiment of the coated cutting tool of the present invention the first $Ti_{1-u}Al_uC_vN_w$ coating layer has a columnar grain morphology and the overall fiber texture of the first $Ti_{1-u}Al_uC_vN_w$ coating layer is characterized in that the maximum intensity of diffraction from the {111} crystallographic planes, as determined by X-ray diffraction (XRD) pole figure measurements or EBSD measurement, occurs within a tilt angle from a normal to the sample substrate surface of α=±20°, preferably α=±10°, more preferably α=±5°, even more preferably α=±1°.

At tilt angles of the maximum intensity of diffraction from the {111} crystallographic planes of the first $Ti_{1-u}Al_uC_vN_w$ coating layer from a normal to the sample substrate surface greater than 20°, the second $Ti_xC_yN_{1-y}$ coating layer is found to have a less pronounced columnar microstructure, and an unfavourable grain boundary orientation having high relative amounts of Σ3 boundaries. Furthermore, $Ti_{1-u}Al_uC_vN_w$ coatings with {111} crystallographic texture, deposited by CVD, exhibit superiour wear resistance compared to $Ti_{1-u}Al_uC_vN_w$ coatings having other texture. Taking the contribution of the wear properties of the first $Ti_{1-u}Al_uC_vN_w$ coating layer to the overall performance of the cutting tool into account, the wear resistance will therefore be insufficient if the maximum intensity of diffraction from the {111} crystallographic planes occurs within a tilt angle from a normal to the surface of greater than 20°, good within a tilt angle of α=±20°, excellent within a tilt angle of α=±10°, superiour within a tilt angle of α=±5°, and optimum within a tilt angle of α=±1°.

In another preferred embodiment of the coated cutting tool of the present invention the length of Σ3-type grain boundaries in the second $Ti_xC_yN_{1-y}$ coating layer is less than 60%, preferably less than 40%, more preferably less than 30% of the total length of the sum of grain boundaries of ΣN-type with N=2n+1, 1≤n≤28, (=Σ3-49-type grain boundaries), the grain boundary character distribution being measured by EBSD.

Even though it has been described in the literature that $Ti_xC_yN_{1-y}$ coatings having high relative amounts of Σ3 grain boundaries show superior wear resistance, these reports are limited to coating layer schemes with $Ti_xC_yN_{1-y}$ as a lower coating layer, and usually an upper functional layer of alumina. It has now surprisingly been found by the inventors of the present invention that within the coating architecture according to this invention with $Ti_xC_yN_{1-y}$ as a second coating layer $Ti_xC_yN_{1-y}$ with a relatively low fraction of Σ3 grain boundary length showed superior results. Even though the mechanism is not yet understood, the inventors found that the coatings produced according to this invention have less than 60% Σ3 grain boundary length of the total Σ3-49 grain boundary length. Coatings with Σ3 length fractions higher than 60% will show poor resistance against thermal cracking. Moreover, the inventors found that coatings with less than 40% Σ3 length fraction exhibit excellent wear behaviour, and coatings with less than 30% Σ3 length fraction show even less thermal cracks.

In another preferred embodiment of the coated cutting tool of the present invention the overall fiber texture of the second $Ti_xC_yN_{1-y}$ coating layer is characterized by a texture coefficient TC (1 1 1)>3.0, preferably TC (1 1 1)>3.75.

With $Ti_xC_yN_{1-y}$ coating layers having a TC (1 1 1)>3, the tools showed even less thermal cracks in milling, and in addition, also less flaking of the coating from the cutting edge. When the $Ti_xC_yN_{1-y}$ coating layer has an even higher texture coefficient TC (1 1 1)>3.75, even less flaking and thermal cracking is observed.

In another preferred embodiment of the coated cutting tool of the present invention the crystals of the first $Ti_{1-u}Al_uC_vN_w$ coating layer and the crystals of the second $Ti_xC_yN_{1-y}$ coating layer have isomorphic crystal structures, preferably face-centered cubic (fcc) crystal structures.

Compared to coatings with the second $Ti_xC_yN_{1-y}$ coating layer grown on a first layer with non-isomorphic structure, such as a $Ti_{1-u}Al_uC_vN_w$ composite coating layer comprising hexagonal AlN, coatings having isomorphic fcc crystal structures in both coating layers exhibit better adhesion of the second coating layer on the first coating layer.

In another preferred embodiment of the coated cutting tool of the present invention the multi-layered wear resistant coating comprises at least one further refractory layer between the substrate surface and the first $Ti_{1-u}Al_uC_vN_w$ coating layer, such at least one further refractory layer being selected from carbides, nitrides, carbonitrides, oxycarbonitrides and borocarbonitrides of one or more of Ti, Al, Zr, V and Hf, or combinations thereof, and being deposited by chemical vapour deposition (CVD) or moderate temperature chemical vapour deposition (MT-CVD), preferably the at least one further refractory layer comprises or consists of a TiN layer.

It is particularly preferred to apply an CVD TiN adhesion layer of a thickness of about 0.3 to 1.5 µm immediately onto the substrate surface, followed by the first $Ti_{1-u}Al_uC_vN_w$ coating layer and the second $Ti_xC_yN_{1-y}$ coating layer.

In another preferred embodiment of the coated cutting tool of the present invention the first coating layer consists of titanium aluminium nitride or carbonitride $Ti_{1-u}Al_uC_vN_w$, with 0.6≤u≤1.0, 0≤v≤0.1 and 0.7≤w≤1.15, preferably with 0.8≤u≤1.0, 0≤v≤0.05 and 0.7≤w≤1.15.

Is has been found that at aluminium contents of u≥0.6 a more pronounced (111) preferential orientation of the second $Ti_xC_yN_{1-y}$ coating layer is obtained. Titanium aluminium carbonitride coating layers with v>0 are preferred to contain carbon in amorphous state within a composite structure purely, or more preferably contain carbon as constituent of the fcc-$Ti_{1-u}Al_uC_vN_w$. At a carbon content of v>0.1 there is a risk of carbon being formed as graphite, which leads to mechanical weakening of the coating, and at a carbon content of y>0.05 carbon may not be completely incorporated into the fcc-$Ti_{1-u}Al_uC_vN_w$, but the coating may have a composite structure including amorphous carbon, which may result in a reduced toughness behaviour of the coating.

Definitions and Methods

Fiber Texture and Texture Coefficient TC

The term "fiber texture", as used herein and as it is generally used in connection with thin films produced by vapor deposition, distinguishes the orientation of the grown grains from random orientation. Three types of textures are usually distinguished in thin films and coatings: (i) random texture, when grains have no preferred orientation; (ii) fiber texture, where the grains in the coating are oriented such that one set of geometrically equivalent crystallographic planes {h k l} is found to be preferentially oriented parallel to the substrate, while there is a rotational degree of freedom of the grains around the fiber axis which is perpendicular to this plane, and thus preferentially orientated perpendicular to the substrate; and (iii) epitaxial alignment (or in-plane texture) on single-crystal substrates, where an in-plane alignment fixes all three axes of the grain with respect to the substrate.

The crystallographic plane of a crystal is defined by the Miller indices, h, k, l. A means to express preferred growth, i. e. that one set of geometrically equivalent crystallographic planes {h k l} is found to be preferentially oriented parallel to the substrate, is the texture coefficient TC (h k l) calculated using the Harris formula on the basis of a defined set of XRD reflections measured on the respective sample. The intensities of the XRD reflections are standardized using a JCPDF-card indicating the intensities of the XRD reflections of the same material, e. g. TiCN, but with random orientation, such as in a powder of the material. A texture coefficient TC (h k l)>1 of a layer of crystalline material is an indication that the grains of the crystalline material are oriented with their {h k l} crystallographic plane parallel to the substrate surface more frequently than in a random distribution, at least compared to the XRD reflections used in the Harris formula to determine the texture coefficient TC.

X-Ray Diffraction (XRD) Measurements

X-ray diffraction measurements were done on a XRD3003 PTS diffractometer of GE Sensing and Inspection Technologies using CuKα-radiation. The X-ray tube was run in point focus at 40 kV and 40 mA. A parallel beam optic using a polycapillary collimating lens with a measuring aperture of fixed size was used on the primary side whereby the irradiated area of the sample was defined in such manner that a spill over of the X-ray beam over the coated face of the sample is avoided. On the secondary side a Soller slit with a divergence of 0.4° and a 25 µm thick NiKβ filter were used. Symmetrical θ-2θ scans within the angle range of 20°<2θ<100° with increments of 0.04° and 1 second counting time have been conducted. On the XRD raw data intensity corrections for thin film absorption were applied to all samples which take into account the limited thickness of the layer in contrast to the natural penetration depth in a bulk material. Furthermore an absorption correction was applied for samples where an additional layer was deposited above the MT-TiCN layer for which the TCs were calculated. See equations below:

$$I_{corr}^{TF} = \frac{I_0}{1 - \exp(-2\mu S/\sin\theta)}$$

$$I_{corr}^{Abs} = \frac{I_0}{\exp(-2\mu S/\sin\theta)}$$

In the equations S is the thickness of the layer in which the TCs are going to be analysed or the thickness of an absorbing top layer respectively. Finally $K\alpha_2$ stripping (Rachinger method), back-ground subtraction and a parabolic peakfit with 5 measuring points were applied. For the calculation of the texture coefficients TC of the MT-TiCN layer a formalism proposed by Harris [Harris, G. B., Philosophical Magazine Series 7, 43/336, 1952, pp. 113-123] was applied. Herein the corrected net peak intensities $I_{corr}$ were correlated to the relative intensities $I_{pdf}$ taken from PDF-card 42-1489.

$$TC^{(hkl)} = \frac{I_{corr}^{(hkl)}}{I_{pdf}^{(hkl)}} \cdot \left( \frac{1}{n} \cdot \sum_{1}^{n} \frac{I_{corr}^{(hkl)}}{I_{pdf}^{(hkl)}} \right)^{-1}$$

Sample Preparation for Scanning Electron Microscopy (SEM)

Inserts were cut in cross section, mounted in a holder and then treated as follows:
1. Grinding with Struers Plano220 disc with water for 6 min
2. Polishing with 9 µm MD-Largo Diamond suspension for 3 min
3. Polishing with 3 µm MD-Dac Diamond suspension for 3:40 min
4. Polishing with 1 µm MD-Nap Diamond suspension for 2 min
5. Polishing/etching with OP-S colloidal silica suspension for at least 12 min (average grain size of the colloidal silica=0.04 µm)

The specimens were ultrasonically cleaned before SEM examination.

CVD Coatings

The CVD coatings were prepared in a radial flow reactor, type Bernex BPX 325S, having 1250 mm height and 325 mm diameter.

EBSD and Σ-type Grain Boundaries

Grain boundaries have a significant influence on material properties such as grain growth, creep, diffusion, electrical, optical and last but not least on mechanical properties. Important properties to be considered are e.g. the density of grain boundaries in the material, the chemical composition of the interface and the crystallographic texture, i.e. the grain boundary plane orientations and grain misorientation. Thereby, the coincidence site lattice (CSL) grain boundaries play an important role. CSL grain boundaries are characterized by the multiplicity index Σ, which is defined as the ratio between the crystal lattice site density of the two grains meeting at the grain boundaries and the density of sites that coincide when superimposing both crystal lattices. For simple structures, it is generally admitted that grain boundaries with low Σ values have a tendency for low interfacial energy and special properties. Thus, the control of the proportion of special grain boundaries and of the distribution of grain misorientations inferred from the CSL model can be considered to be important to the properties of ceramics and a way to enhance these properties.

In recent years, a scanning electron microscope (SEM)-based technique known as electron backscatter diffraction (EBSD) has emerged and has been used to study grain boundaries in ceramic materials. The EBSD technique is based on automatic analysis of Kikuchi-type diffraction patterns generated by backscattered electrons. A review of the method is provided by: D. J. Prior, A. P. Boyle, F. Brenker, M. C. Cheadle, A. Day, G. Lopez, L. Peruzzo, G. J. Potts, S. M. Reddy, R. Spiess, N. E. Timms, P. W. Trimby, J. Wheeler, L. Zetterström, The application of electron backscatter diffraction and orientation contrast imaging in the SEM to textural problems in rocks, Am. Mineral. 84 (1999) 1741-1759. For each grain of the material to be studied, the crystallographic orientation is determined after indexing of the corresponding diffraction pattern. Available commercial software makes the texture analyses as well as determination of grain boundary character distribution (GBCD) relatively uncomplicated by using EBSD. Application of EBSD to interfaces has allowed the misorientation of grain boundaries to be characterized for large sample populations of boundaries. Typically the misorientation distribution has been linked to the processing conditions of a material. The grain boundary misorientation is achieved via usual orientation parameters such as, the Euler angles, angle/axis pair, or Rodriquez vector. The CSL model is used widely as characterization tool. Over the last decade, a research area known as Grain Boundary Engineering (GBE) has emerged. GBE aims to enhance crystallography of the grain boundaries by developing improved process conditions and, in such way, to achieve better materials. EBSD has recently been used to characterize hard coatings, for reference see, H. Chien, Z. Ban, P. Prichard, Y. Liu, G. S. Rohrer, "Influence of Microstructure on Residual Thermal Stresses in $TiC_xN_{1-x}$ and alpha-$Al_2O_3$ Coatings on WC-Co Tool Inserts," Proceedings of the 17th Plansee Seminar 2009 (Editors: L. S. Sigl, P. Rodhammer, H. Wildner, Plansee Group, Austria) Vol. 2, HM 42/1-11.

For the preparation of the samples for EBSD measurement, the coating surfaces of the samples were polished subsequently using slurries of diamond having average grain sizes of 3 µm and 1 µm, respectively. Then, the samples were polished using colloidal silica having an average grain size of 0.04 µm. The last polishing step was done manually, and polishing time was increased stepwise until the sample quality was good enough to perform the EBSD maps, i.e. indexing of EBSD patterns would be accomplished with an average confidence index (CI)>0.2 at typical scan rates of 50-100 frames per second. The precise preparation conditions will depend on the individual sample and equipment, and can easily be determined by a person skilled in the art. The polishing removed typically between 0.5 µm and 2 µm of the outer MT-$Ti_xC_yN_{1-y}$ layer, as determined by measurement of calotte sections prior to and after the preparation, so that the remaining thickness of the second $Ti_xC_yN_{1-y}$ coating layer was between 50% and 90% of the initial layer thickness. The information depth of the electron diffraction patterns is small (on the order of a few tens of nanometers) compared to the remaining layer thickness. Care was taken to ensure that the polished surfaces were smooth and parallel to the original coating surface. Finally, the samples were ultrasonically cleaned before EBSD examination.

After cleaning the polished surfaces were analysed by SEM (Zeiss Supra 40 VP) equipped with EBSD (EDAX Digiview). The EBSD data were collected sequentially by positioning the focused electron beam on measurement points forming a hexagonal grid, using a sufficiently small step size. The normal of the sample surface was tilted 70° to the incident beam, and analysis was carried out at 15 kV. High current mode was applied together with 60 µm or 120 µm apertures. Acquisitions were made on polished surfaces with the step size of the measurement grid being chosen at least 5 times smaller than the average grain width as roughly estimated from the SEM images acquired prior to the measurement, assuring that an average of ≥25 data points per grain will be obtained. From this preliminary estimation of grain size, the surface area covered by the EBSD map was defined large enough to comprise at least 10000 grains, so that sufficient grain statistics for the evaluation of texture and misorientation is assured.

For noise reduction, a grain CI standardization with grain tolerance angle 5° and minimum grain size of 5 or 10 measurement points depending on the grain size, followed by grain dilatation, was applied as a clean-up procedure. The number of grains in the map after clean-up was well above 10000 in all cases.

For the classification of coincidence site lattice (CSL) boundaries (Σ grain boundaries), the angle tolerance Δ used corresponded to the Brandon criterion $\Delta = K/\Sigma^n$ (K=15, n=0.5). The fraction of CSL boundaries of ΣN-type with N=2n+1, 1≤n≤28 (=Σ3-49-type grain boundaries) was thus determined.

Measurement of $Ti_xC_yN_{1-y}$ Coating Layer Thickness L and Average Grain Diameter W For the purpose of the present invention, the layer thickness L of the $Ti_xC_yN_{1-y}$ coating layer was measured on light microscopical or electron microscopical images of a calotte section or polished cross section of the coating layer. The average grain diameter W was obtained on a planar polished sample by EBSD measurement according to the procedure and definitions given above. The remaining layer thickness after polishing was between 50% and 90% of the initial layer thickness, i.e. the average grain diameter W was measured at a height of 50 to 90% of the initial layer thickness.

Inspection of polished cross sections of the $Ti_xC_yN_{1-y}$ coating layers according to this invention in the SEM showed a columnar microstructure. It can be assumed that basically all of the columnar grains protruding to the outer surface of the layer were nucleated on the interface between the first $Ti_{1-u}Al_uC_vN_w$ coating layer and the second $Ti_xC_yN_{1-y}$ coating layer. Accordingly, the layer thickness corresponds approximately to the grain lengths of the $Ti_xC_yN_{1-y}$ coating layer.

Isomorphic Crystal Structures

For the purpose of the present invention, the term "isomorphic crystal structures" means that the crystals belong to the same space group, even though the unit cell dimensions may be different due to different sizes of the involved atoms present in the crystals of different chemical compositions. As an example according to the present invention, $Ti_{1-u}Al_uC_vN_w$ crystals and $Ti_xC_yN_{1-y}$ crystals may have isomorphic crystal structures, such as face-centred cubic (fcc) crystal structures.

EXAMPLES

Example 1

Sample Preparation and Analysis

Cemented carbide cutting tool substrate bodies (composition: 90.5 wt-% WC, 1.5 wt-% TaC/NbC and 8.0 wt-% Co; geometry: SEHW1204AFN) were placed on charging trays and coated in a radial flow CVD reactor, type Bernex BPX 325S, having 1250 mm height and 325 mm diameter.

The experimental conditions for the deposition of the coatings according to the present invention (coatings 1 and 2) and for the comparative example (coating 3) are shown in table 1. All coatings according to the present invention and in the comparative example were started with a thin TiN adhesion layer. The first $Ti_{1-u}Al_uN_w$ coating layer and the second $Ti_xC_yN_{1-y}$ coating layer according to the invention were deposited directly on top of each other without any interlayers or nucleation steps.

X-Ray Diffraction (XRD) Measurements and Texture Coefficients

The outermost MT-$Ti_xC_yN_{1-y}$ layers of the coatings were analysed by XRD, and the texture coefficients of the (h k l) reflections (1 1 1), (2 0 0), (2 2 0) and (3 1 1) of TiCN were determined, as described herein. A thin film correction was applied to the XRD raw data. The results are shown in table 2.

EDS Analysis of Elemental Compositions

The elemental compositions of the $Ti_{1-u}Al_uC_vN_w$ and $Ti_xC_yN_{1-y}$ layers in the coatings were determined by EDS and from the XRD peak positions by application of Vegard's law using the JCPDF cards No. 32-1383 for TIC and 38-1420 for TiN, respectively. The results are shown in table 3. The experimental error is estimated to ±3 at-%.

TABLE 3

Elemental compositions of $Ti_{1-u}Al_uC_vN_w$ and $Ti_xC_yN_{1-y}$ layers

|  | $Ti_{1-u}Al_uC_vN_w$ | $Ti_xC_yN_{1-y}$ |
|---|---|---|
| Coating no. 1 | $Ti_{0.13}Al_{0.87}C_0N_{1.13}$ | $TiC_{0.56}N_{0.44}$ |
| Coating no. 2 | $Ti_{0.16}Al_{0.84}C_0N_1$ | $TiC_{0.57}N_{0.43}$ |
| Coating no. 3 | — | $TiC_{0.55}N_{0.45}$ |

EBSD Analysis

Table 4 shows details about the EBSD measurements and data processing and results.

For the classification of coincidence site lattice (CSL) boundaries (Σ grain boundaries), the angle tolerance Δ used corresponded to the Brandon criterion $\Delta=K/\Sigma^n$ (K=15, n=0.5). The fraction of CSL boundaries of ΣN-type with N=2n+1, 1≤n≤28 (=Σ3-49-type grain boundaries) was thus determined.

The misorientation angle has been evaluated in the range between 5° and 62.8° being limited by the grain tolerance angle used in clean-up and the maximum possible misorientation angle for cubic symmetry, respectively. The distribution of grain boundary misorientations was evaluated by plotting the fraction of grain boundary length over misorientation angle in 50 pitches from 5° to 62.8°, i.e. increments

TABLE 1

Experimental conditions for coatings

| Coating No. | Layer Sequence | Layer Thickness [μm] | Coating Time [min] | Pressure [kPa] | Temperature [° C.] | Gas concentrations [Vol.-%] | | | | | |
|---|---|---|---|---|---|---|---|---|---|---|---|
| | | | | | | $H_2$ | $N_2$ | $TiCl_4$ | $AlCl_3$ | $CH_3CN$ | $NH_3$ |
| 1 (Inv.) | TiN | 0.4 | 90 | 15 | 850 | 55.0 | 44.0 | 1.03 | 0 | 0 | 0 |
| | $Ti_{1-u}Al_uC_vN_w$ | 8.0 | 150 | 0.35 | 710 | 98.7 | 0 | 0.03 | 0.23 | 0 | 1.1 |
| | MT-$Ti_xC_yN_{1-y}$ | 4.5 | 120 | 7.5 | 800 to 835 (ramp) | 86.9 | 10.9 | 1.77 | 0 | 0.47 | 0 |
| 2 (Inv.) | TiN | 0.4 | 90 | 15 | 850 | 55.0 | 44.0 | 1.03 | 0 | 0 | 0 |
| | $Ti_{1-u}Al_uC_vN_w$ | 2.5 | 75 | 0.35 | 675 | 98.7 | 0 | 0.03 | 0.23 | 0 | 1.1 |
| | MT-$Ti_xC_yN_{1-y}$ | 2.8 | 90 | 7.5 | 823 to 850 (ramp) | 86.9 | 10.9 | 1.77 | 0 | 0.47 | 0 |
| 3 (Comp.) | TiN | 0.5 | 55 | 16 | 900 | 59.8 | 39.1 | 1.1 | 0 | 0 | 0 |
| | MT-$Ti_xC_yN_{1-y}$* | 5.0 | 26 | 6 | 870 | 55.2 | 41.4 | 2.7 | 0 | 0.7 | 0 |
| | | | 66 | 9 | | 85.0 | 12.8 | 1.7 | 0 | 0.5 | 0 |

*deposited under 2 consecutive deposition conditions

TABLE 2

Texture coefficients of the outermost MT- $Ti_xC_yN_{1-y}$ layers of the coatings

| | Texture Coefficient (TC) | | |
|---|---|---|---|
| (h k l) reflection | Coating no. 1 | Coating no. 2 | Coating no. 3 |
| 1 1 1 | 3.85 | 3.53 | 1.05 |
| 2 0 0 | 0.03 | 0.01 | 0.53 |
| 2 2 0 | 0.01 | 0.04 | 1.46 |
| 3 1 1 | 0.11 | 0.42 | 1.06 | of 1.16°, thus considering only boundaries between identified grains in the distribution. The obtained histograms of measured (correlated) misorientation distribution were compared to the uncorrelated (texture derived) distributions as calculated by the OIM analysis software. For each pitch of misorientation angle, the deviation of the correlated misorientation angle number fraction from the uncorrelated number fraction has been calculated. It has been found that for the $Ti_xC_yN_{1-y}$ layers according to the invention the deviation is by a factor smaller than 10 for all pitches. In contrast, the measured misorientation angle distribution of the layers according to the prior art shows much more pronounced spikes at 60°, the number fraction being more than 10 times higher than the uncorrelated number fraction, which correspond to a high amount of Σ3 boundaries.

TABLE 4

EBSD measurement and data processing

| Coating No. | 1 | 2 | 3 |
|---|---|---|---|
| Thickness of TiCN layer - as-deposited [µm] | 4.5 | 2.8 | 5.0 |
| Thickness of TiCN layer - after polishing for EBSD measurement µm] | 3.2 | 1.8 | 3 |
| EBSD mapping and clean-up parameters | | | |
| Map Size [µm × µm] | 150 × 150 | 75 × 75 | 40 × 40 |
| Step Size [µm] | 0.075 | 0.05 | 0.05 |
| Number of points | 4621155 | 2600367 | 739662 |
| Average CI | 0.45 | 0.34 | 0.23 |
| Minimum Grain Size used for clean-up [pixels] | 10 | 5 | 5 |
| No. of points corrected by clean-up | 85193 | 110461 | 100144 |
| fraction of points changed by clean-up | 0.018 | 0.042 | 0.135 |
| EBSD data after clean-up | | | |
| average grain diameter [µm] | 1.16 ± 0.64 | 0.44 ± 0.25 | 0.30 ± 0.13 |
| average grain area [µm²] | 1.38 ± 1.49 | 0.20 ± 0.23 | 0.084 ± 0.08 |
| layer thickness/average grain diameter | 3.9 | 6.4 | 16.7 |
| overall fraction of CSL boundaries (Σ3-Σ49)* | 0.18 | 0.27 | 0.41 |
| fraction of Σ3 boundaries* | 0.05 | 0.10 | 0.29 |
| ratio (number fraction Σ3/number fraction all CSL (Σ3-Σ49) boundaries)* | 0.27 | 0.39 | 0.70 |
| MD = maximum deviation of misorientation from correlated number fraction*/** | 2.8 | 8.1 | 17.1 |

*only boundaries between identified grains
**number fractions of misorientation calculated in 50 pitches from 5° to 62.8,° i.e. increments of 1.16°

Milling Tests

The cutting tools inserts with coatings nos. 1, 2 and 3 were examined in the following milling application:
Workpiece material: Grey cast iron DIN GG25
Operation: Dry milling
Feed per tooth: $f_z$=0.2 mm
Depth of cut: $a_p$=3 mm
Setting angle: K=45°
Cutting speed: $v_c$=283 m/min The development of the maximum flank wear, $V_{Bmax}$, on the main cutting edge and the number of comb cracks were observed over a milling distance of 4800 mm in 800 mm steps. In table 5, the development of $V_{Bmax}$ over the milling distance and the number of comb cracks at 4800 mm are shown.

In the milling test the coating according to the present invention showed a significantly higher resistance against flank wear, as well as a remarkably higher resistance against thermo mechanical shock, as shown by the non-occurrence of comb cracks.

TABLE 5

Milling Test Results

| Milling Distance | Maximum Flank Wear $V_{Bmax}$ | | |
|---|---|---|---|
| [mm] | Coating No. 1 | Coating no. 2 | Coating no. 3 |
| 0 | 0 | 0 | 0 |
| 800 | 0.02 | 0.04 | 0.06 |
| 1600 | 0.04 | 0.06 | 0.10 |
| 2400 | 0.04 | 0.08 | 0.18 |
| 3200 | 0.06 | 0.10 | 0.22 |
| 4000 | 0.08 | 0.12 | 0.28 |
| 4800 | 0.12 | 0.14 | 0.40 |
| Comb Cracks after 4800 mm | 0 | 0 | 5 |

The invention claimed is:

1. A coated cutting comprising:
a substrate of cemented carbide, cermet, ceramics, steel or cubic boron nitride; and
a multi-layered wear resistant coating having a total coating thickness from 5 to 25 µm and including at least two refractory coating layers deposited by chemical vapour deposition (CVD) or moderate temperature chemical vapour deposition (MT-CVD), the at least two refractory coating layers including a first coating layer and a second coating layer being deposited on top of each other, wherein the first coating layer consists of titanium aluminium nitride or carbonitride $Ti_{1-u}Al_uC_vN_w$, with 0.2≤u≤1.0, 0≤v≤0.25 and 0.7≤w≤1.15, deposited by CVD at a reaction temperature in the range from 600° C. to 900° C., the second coating layer being titanium carbonitride $Ti_xC_yN_{1-y}$, with 0.85≤x≤1.1 and 0.4≤y≤0.85, deposited on top of the first coating layer by MT-CVD at a reaction temperature in the range from 600° C. to 900° C., and wherein the second $Ti_xC_yN_{1-y}$ coating layer has a columnar grain morphology, an overall fiber texture of the $Ti_xC_yN_{1-y}$ coating layer having a texture coefficient TC (1 1 1)>2, the TC (1 1 1) being defined as:

$$TC(111) = \frac{I(111)}{I_0(111)} \left[ \frac{1}{n} \sum_{n=1}^{n} \frac{I(hkl)}{I_0(hkl)} \right]^{-1},$$

wherein
(h k l)=measured intensity of the (hkl) reflection
$I_0$(h k l)=standard intensity of the standard powder diffraction data according to
JCPDF-card no. 42-1489
n=number of reflections used in the calculation, whereby the (hkl) reflections used are: (1 1 1), (2 0 0), (2 2 0) and (3 1 1).

2. The coated cutting tool of claim 1, wherein the second $Ti_xC_yN_{1-y}$ coating layer has a thickness L and an average grain diameter W, and a ratio L/W<5.

3. The coated cutting tool of claim 1, wherein the grains of the second $Ti_xC_yN_{1-y}$ coating layer have an average grain diameter W of W≥0.4 µm.

4. The coated cutting tool of claim 1, wherein the first $Ti_{1-u}Al_uC_vN_w$ coating layer has a columnar grain morphology and the overall fiber texture of the first $Ti_{1-u}Al_uC_vN_w$ coating layer having a maximum intensity of diffraction from the {111} crystallographic planes, as determined by X-ray diffraction (XRD) pole figure measurements or EBSD measurement, which occurs within a tilt angle from a normal to a sample substrate surface of α=±20°.

5. The coated cutting tool of claim 1, wherein a length of Σ3-type grain boundaries in the second $Ti_xC_yN_{1-y}$ coating layer is less than 60%, of a total length of a sum of grain boundaries of ΣN-type with N=2n+1, 1≤n≤28, (=Σ3-49-type grain boundaries), the grain boundary character distribution being measured by EBSD.

6. The coated cutting tool of claim 1, wherein the overall fiber texture of the second $Ti_xC_yN_{1-y}$ coating layer is has a texture coefficient TC (1 1 1)>3.0.

7. The coated cutting tool of claim 1, wherein crystals of the first $Ti_{1-u}Al_uC_vN_w$ coating layer and crystals of the second $Ti_xC_yN_{1-y}$ coating layer have isomorphic crystal structures or face-centered cubic (fcc) crystal structures.

8. The coated cutting tool of claim 1, wherein the multi-layered wear resistant coating includes at least one further refractory layer between the substrate surface and the first $Ti_{1-u}Al_uC_vN_w$ coating layer, the at least one further refractory layer being selected from carbides, nitrides, carbonitrides, oxycarbonitrides and borocarbonitrides of one or more of Ti, Al, Zr, V and Hf, or combinations thereof, and being deposited by chemical vapour deposition (CVD) or moderate temperature chemical vapour deposition (MT-CVD).

9. The coated cutting tool of claim 8, wherein the at least one further refractory layer includes a TiN layer.

10. The coated cutting tool of claim 1, wherein the first coating layer is titanium aluminium nitride or carbonitride $Ti_{1-u}Al_uC_vN_w$, with 0.6≤u≤1.0, 0≤v≤0.1 and 0.7≤w≤1.15.

* * * * *